United States Patent
Tomizawa et al.

(10) Patent No.: US 8,614,510 B2
(45) Date of Patent: Dec. 24, 2013

(54) SEMICONDUCTOR DEVICE INCLUDING A METAL WIRING WITH A METAL CAP

(75) Inventors: Hideyuki Tomizawa, Rensselaer, NY (US); Noriaki Matsunaga, Chigasaki (JP); Tadayoshi Watanabe, Oita (JP); Shiro Mishima, Yokohama (JP); Masako Kodera, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 703 days.

(21) Appl. No.: 12/726,604

(22) Filed: Mar. 18, 2010

(65) Prior Publication Data

US 2010/0237501 A1    Sep. 23, 2010

(30) Foreign Application Priority Data

Mar. 19, 2009 (JP) .................................. 2009-068960

(51) Int. Cl.
*H01L 23/48* (2006.01)
*H01L 23/52* (2006.01)

(52) U.S. Cl.
USPC ............................ 257/762; 257/759; 257/763

(58) Field of Classification Search
USPC .................. 257/642, 759, 761–763, E22.161, 257/E23.161
See application file for complete search history.

(56) References Cited

U.S. PATENT DOCUMENTS

2005/0104216 A1* 5/2005 Cabral et al. .................. 257/758
2005/0263857 A1* 12/2005 Yuasa et al. .................. 257/642

FOREIGN PATENT DOCUMENTS

| JP | 2002-353308 | 12/2002 |
| JP | 2005-056945 | 3/2005 |
| JP | 2006-198552 | 8/2006 |
| JP | 2007-103850 | 4/2007 |
| JP | 2007-157959 | 6/2007 |

OTHER PUBLICATIONS

Paul Besser et al., "A novel materials solution to enable CoWP metal capping with ULK by reducing line-to-line leakage", C.K. Hu, Applied Physics Letter vol. 83, No. 869, 2003, pp. 53-54.
Office Action issued Jul. 23, 2013, in Japanese Patent Application No. 2009-068960, filed Mar. 19, 2009 (with English-language Translation).

* cited by examiner

*Primary Examiner* — Hung Vu
(74) *Attorney, Agent, or Firm* — Oblon, Spivak, McClelland, Maier & Neustadt, L.L.P.

(57) ABSTRACT

A method for manufacturing a semiconductor device includes forming an insulating film including silicon, oxygen, carbon and hydrogen above a semiconductor substrate, forming a wiring trench in the insulating film, forming a metal film to be a metal wiring on the insulating film such that the metal film is provided in the wiring trench, forming the metal wiring by removing the metal film outside the wiring trench, performing a hydrophobic treatment to the surface of the insulating film after the forming the metal wiring, and forming a metal cap selectively on an upper surface of the metal wiring by plating after the performing the hydrophobic treatment.

8 Claims, 4 Drawing Sheets

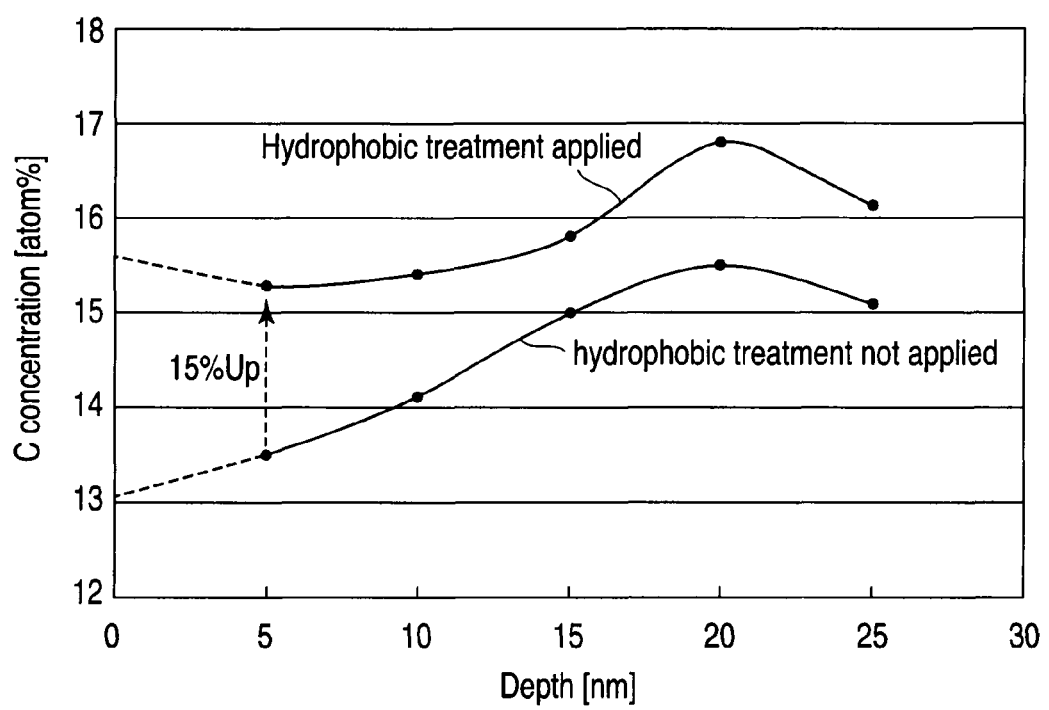
F I G. 5

SEMICONDUCTOR DEVICE INCLUDING A METAL WIRING WITH A METAL CAP

CROSS-REFERENCE TO RELATED APPLICATIONS

This application is based upon and claims the benefit of priority from prior Japanese Patent Application No. 2009-068960, filed Mar. 19, 2009, the entire contents of which are incorporated herein by reference.

BACKGROUND

Recently, a Cu wiring having lower electric resistance than an Al wiring is used as a wiring of LSI. On the other hand, an insulating film called a low-k film having lower dielectric constant than a silicon oxide film is used as an inter-wiring insulting film.

Cu has a diffusion coefficient larger than Al, and then it can not be used as wiring material so long as an anti-diffusion film is employed. A conductive anti-diffusion film such as a Ta film is used with respect to side and bottom surfaces of the Cu wiring.

On the other hand, an insulative anti-diffusion film such as a silicon nitride film has been conventionally used with respect to an upper surface of the Cu wiring.

However, adhesion between the Cu wiring and the insulative anti-diffusion film is weak, and then electromigration (EM) lifetime has notably lowered along with a scaling of wiring. Therefore, a metal cap is used for the purpose of improving EM lifetime (see JP 2007-157959, JP 2007-103850).

The metal cap is formed by using plating process. The reason employing the plating process is that it makes possible to form the metal cap selectively on the upper surface of the Cu wiring.

However, the conventional method for forming the metal cap employing the plating process fails in plating selectivity, and then metal material of the metal cap is also deposited on the upper surface of the insulating film between the wirings. This deposited metal material (metal residue) causes a leakage path, and then leakage current between the wirings increases when a certain voltage higher than predetermined level is applied between the wirings.

SUMMARY

According to an aspect of the present invention, there is provided a method for manufacturing a semiconductor device comprising: forming an insulating film including silicon, oxygen, carbon and hydrogen above a semiconductor substrate; forming a wiring trench in the insulating film; forming a metal film to be a metal wiring on the insulating film such that the metal film is provided in the wiring trench; forming the metal wiring by removing the metal film outside the wiring trench; performing a hydrophobic treatment to the surface of the insulating film after the forming the metal wiring; and forming a metal cap selectively on an upper surface of the metal wiring by plating after the performing the hydrophobic treatment.

According to an aspect of the present invention, there is provided a semiconductor device comprising: a semiconductor substrate; an insulating film including silicon, oxygen, carbon and hydrogen provided above a semiconductor substrate, the insulating film being provided with a wiring trench, the insulating film comprising first and second regions, the first region including a surface of the insulating film, the second region provided beneath the first region and including an interface with the first region, a carbon concentration of the second region from the interface to a predetermined distance of depth becoming lower as the depth from the interface becoming deeper, a carbon concentration of the second region deeper than the predetermined distance becoming higher as the depth becoming deeper and reaching carbon concentration higher than that of the surface of the insulating film; a metal wiring provided in the wiring trench; and a metal cap provided on an upper surface of the metal wiring.

BRIEF DESCRIPTION OF THE DRAWING

FIG. 5 is a graph showing C concentration profiles of an embodiment and a comparative example.

DETAILED DESCRIPTION

Various embodiments will be described below with reference to the accompanying drawings.

First Embodiment

FIGS. 1A to 2D are cross-sectional views to explain a method for manufacturing a semiconductor device of a first embodiment.

Figure 1A:
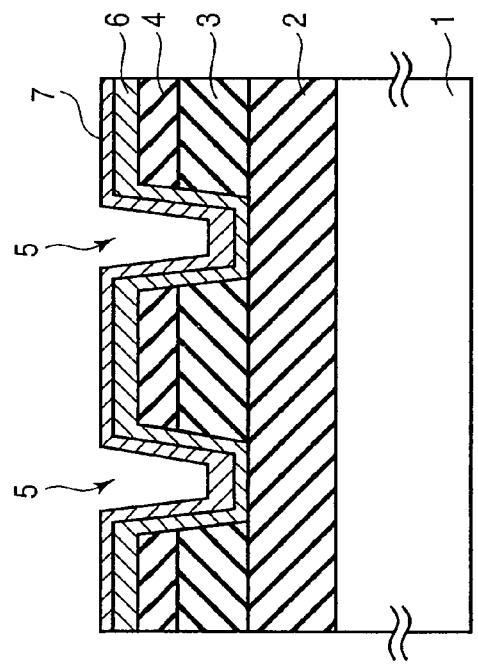
FIGS. 1A to 2D are cross-sectional views to explain a method for manufacturing a semiconductor device according to a first embodiment.

As shown in FIG. 1A, an interlayer insulating film 2 is formed on a Si substrate 1. The surface of the Si substrate 1 is formed with elements such as transistors (not shown). The following insulating films for forming wirings are successively formed on the interlayer insulating film 2. One is a first insulating film (hereinafter, referred to as a bulk insulating film) 3. The other is a second insulating film (hereinafter, referred to as a cap insulating film) 4.

The bulk insulating film 3 is a low-dielectric constant insulating film called as a low-k film. This low-dielectric constant insulating film is an insulating film having a dielectric constant k less than 2.5. If the low-k film is formed by using a coating process, it is formed as an organic insulating film in general. The cap insulating 4 is a SiOC type insulating film.

Here, a multi-layer insulating film (hybrid insulating film) structure of the bulk insulating film 3 and the cap insulating film 4 is used as an inter-wiring insulating film, but only the bulk insulating film 3 formed of a single-layer insulating film or only the cap insulating film 3 formed of a single-layer insulating film may be used.

Figure 1C:
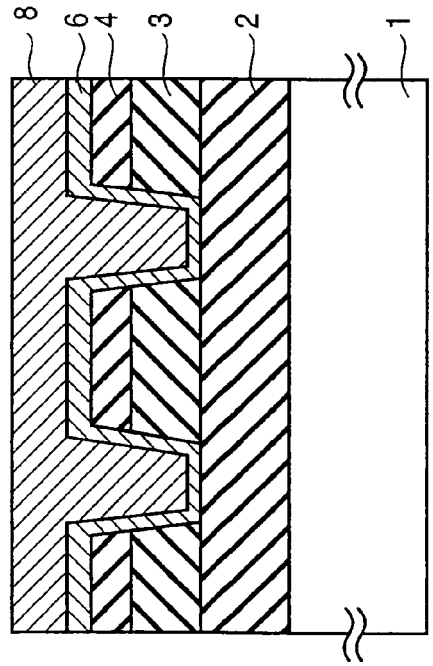
Figure 1B:
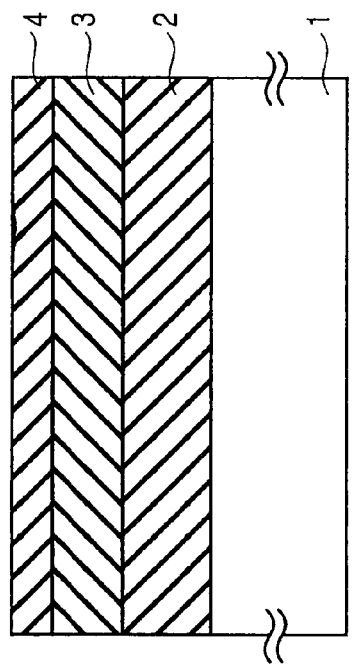

As shown in FIG. 1B, a wiring trench 5 is formed by etching the cap insulating film 4 and the bulk insulating film 3 by RIE (reactive ion etching) process using a resist pattern (not shown) as a mask.

As shown in FIG. 1C, a barrier metal film 6 is formed on the entire surface to cover the inner surface (side surface and bottom surface) of the wiring trench 5. The barrier metal film 6 is, for example, a Ta film or Ti film. A Cu seed film 7 is formed on the barrier metal film 6. The barrier metal film 6 and the Cu seed film 7 are formed by sputtering process, for example.

Figure 1D:
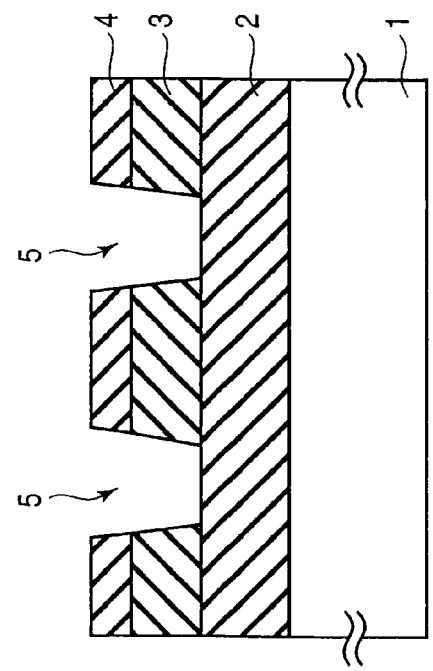
Figure 3:
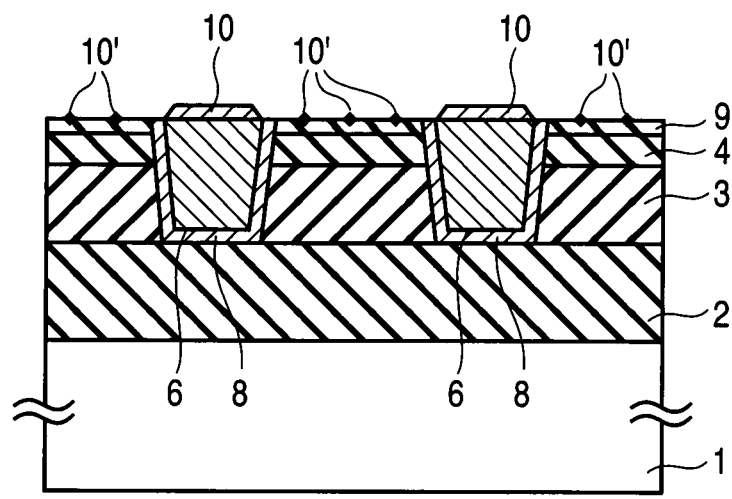
FIG. 3 is a cross-sectional view showing Co residue (metallic residue) generated on a damage layer.

As shown in FIG. 1D, a Cu film to be as a Cu wiring is formed on the entire surface by plating process such that the wiring trench 5 is filled with the Cu film. A Cu seed film 7 formed in the step of FIG. 3 is not distinguished from a Cu film 8 in this step (Cu plating step), therefore, in the drawings after FIG. 1D, the two Cu films are illustrated as one Cu film 8.

Figure 2A:
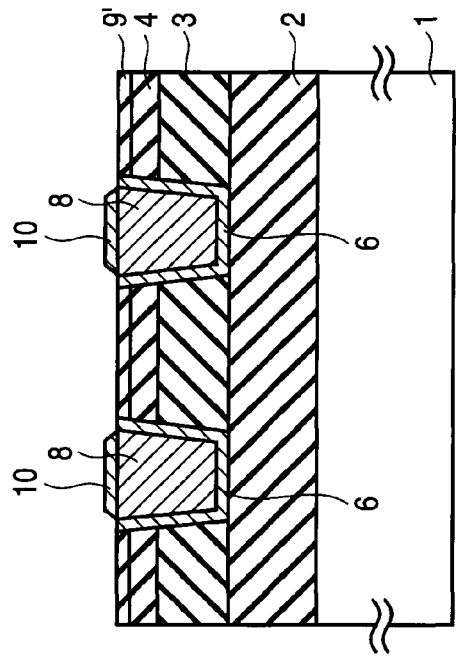

As shown in FIG. 2A, the Cu film 8 and the barrier metal film 6 outside the wiring trench 5 are removed and the surface (exposed upper surface of cap insulating film 4, Cu film 8 and barrier metal film 6) is planarized by CMP process. In this way, the Cu film 8 formed on the entire surface in the step of FIG. 1D is processed into the Cu wiring 8 (damascene wiring) filled in the wiring trench 5. In addition, a region (surface region) 9 having received damage due to the CMP process and due to the post treatment step of the CMP process (pure-water rinse step or step using substance containing OH group such as an IPA dry step) is formed on the surface of the cap insulating film 4. The surface region 9 serves as a damage layer of the cap insulating film. Therefore, in the present embodiment, a process for repairing the damage layer, which does not conventionally performed, is carried out.

Figure 2B:
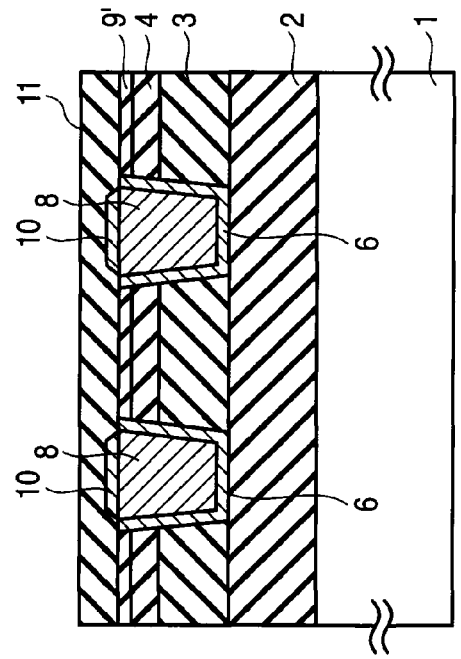

As shown in FIG. 2B, a wet repair treatment is carried out with respect to the surface region 9. This repair treatment is a hydrophobic treatment with respect to the surface region 9 using a solution containing DAMS (diacetoxymethylsilane), for example.

In the step of FIG. 2A, Si—$CH_3$ bond inherently existing on the surface of the cap insulating film (SiOC type insulating film) 4 is cut by the CMP process, and then a reaction between water included in the post treatment step of the CMP process and Si occurs, which results in the surface of the cap insulting film 4 being terminated by Si—OH group. In consequence, the surface of the cap insulting film 4 is hydrophilizated after the CMP process. The hydrophilizated region of the surface is the surface region 9 (damage layer).

If such the surface region 9 (hydrophilic region) is remained at the time of forming the Co film as a metal cap by plating process, Co in the plating solution reacts with the OH group of the surface region 9. This reaction forms Co $(OH)_2$, and Co grows on the surface region 9, hence as shown in FIG. 3, there occurs the generation of Co residue (metal residue) 10' on the surface region 9. This Co residue 10' may causes the leakage path, and then the wiring leakage current may increase.

Therefore, in the present embodiment, the repair treatment of the damage is performed, in which the surface region 9 is imparted with a hydrophobic surface character (Si—$CH_3$ bond) by performing the hydrophobic treatment with respect to the surface region 9. The entire surface region 9 may be imparted with the hydrophobic surface character.

Figure 2C:
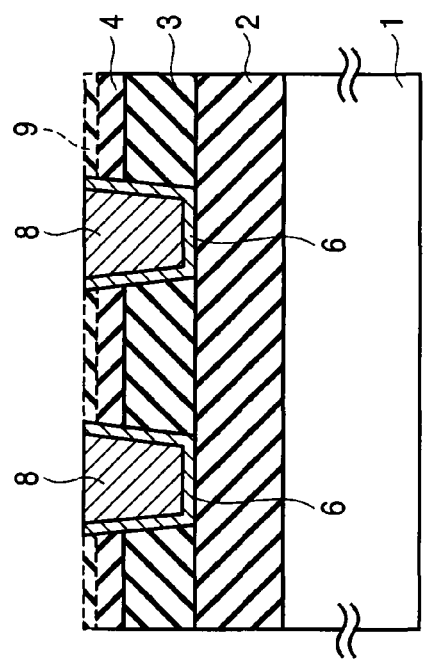

As shown in FIG. 2C, a metal cap 10 containing Co is formed on the Cu wiring 8 by plating process after the performing of the repair treatment (hydrophobic treatment). The metal cap 10 formed in this manner is selectively formed on the Cu wiring 8, and the plating selectivity is not reduced. The metal cap 10 has a function of improving EM lifetime since the metal cap 10 prevents Cu atoms from flowing to an interface between the Cu wiring 8 and a barrier insulating film 11 to be formed in the next step.

The reason of Cu atoms transport is a current flow in the Cu wiring 8 which arises by application of voltage (electric field) to the Cu wiring 8 at the time of device operation.

Figure 2D:
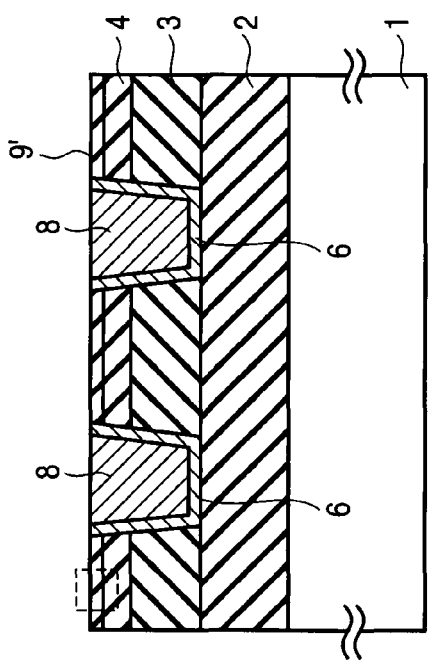

As shown FIG. 2D, after the metal cap 10 is formed, the known steps such as forming a barrier insulating film 11 having Cu anti-diffusion function or the like are followed.

Figure 4:
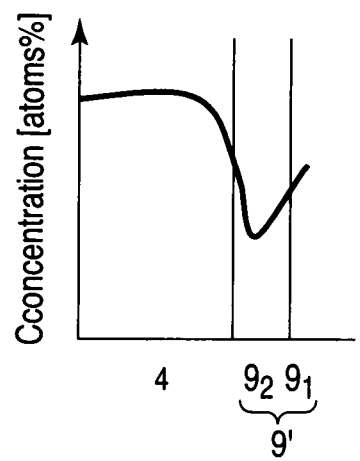
FIG. 4 is a graph showing a C concentration profile of a damage layer and a cap insulating film.

FIG. 4 is a graph showing a C concentration profile in a region surrounded by the broken line in FIG. 2.

A region $9_1$ denotes a region (first region) of the surface region subjected to the hydrophobic treatment, which is actually made hydrophobic. A region $9_2$ denotes a region (second region) of the surface region subjected to the hydrophobic treatment, which is not made hydrophobic in practical.

As seen from FIG. 4, the C concentration is different among the first region $9_1$, the second region $9_2$ and the cap insulating film 4. The carbon concentration of the first region $9_1$ becomes lower as the depth from the surface thereof (surface of cap insulating film 4) becomes deeper. The carbon concentration of the second region $9_2$ becomes lower as the depth from an interface with the first region $9_1$ becomes deeper to a predetermined level of depth, and when the depth exceeds the predetermined level, the carbon concentration becomes higher as the depth becomes deeper (the concentration becomes the lowest (the minimum) at the predetermined level). Finally, the carbon concentration of the second region $9_2$ exceeds carbon concentration of the first region $9_1$ on the surface.

The reason to be such a C concentration profile is considered as follows. The C concentration is temporarily lowered since the Si—$CH_3$ bond is cut by the CMP process. But the C concentration is increased by the hydrophobic treatment which generates the Si—$CH_3$ bond.

FIG. 5 is a graph showing a C concentration profile with the hydrophobic treatment (an embodiment) and a C concentration profile without the hydrophobic treatment (comparative example).

The depth is defined as the direction from the surface region 9 toward the cap insulating film 4, and the depth 0 nm is the surface of the region 9. In FIG. 5, a range from the depth 0 to 5 nm corresponds to the region $9_1$ of FIG. 4, and a range from the depth 5 to 15 nm corresponds to the region $9_2$ of FIG. 4, and a range beyond 15 nm corresponds to the cap insulating film 4.

As seen from FIG. 5, when the hydrophobic treatment is not performed, the C concentration decreases in the range from the depth 15 nm to 5 nm corresponding to the region $9_2$, but when the hydrophobic treatment is performed, the decrease of the C concentration is a little in the same region. The C concentration in the range from 0 to 5 nm is not accurately determined because of analysis accuracy, but in general, the profile in the range is considered to be shown by the broken line because the C concentration is decreased by CMP process damage. Therefore, if the hydrophobic treatment is not performed, the C concentration becomes low in the vicinity of the surface, and conversely, if the hydrophobic treatment is performed, the C concentration becomes high in the vicinity of the surface. When the C densities are compared at the depth of 5 nm, the C concentration with the hydrophobic treatment is higher than the C concentration without the hydrophobic treatment by about 15%.

In this way, since the C concentration of the surface region 9 (C concentration reduced region) formed by CMP process is increased by the hydrophobic treatment, the effect of utilizing the cap insulating film 4 as a low-k film (reduction of inter-wiring capacitance) is obtained in the present embodiment.

In the present embodiment, the metal cap containing Co is given as one example of the metal cap selectively formed on the Cu wiring, a metal cap containing a metal material such as ruthenium (Ru) or tungsten (W), or a metal cap containing an alloy containing two or more of Co, Ru and W may be used. For example, CoWP (cobalt-tungsten-phosphorous) alloy or CoWB (cobalt-tungsten-boron) is given as the alloy containing two or more of Co, Ru and W.

Second Embodiment

A second embodiment is different from the first embodiment in that a heat treatment for removing moisture (OH group) in the cap insulating film 4 or surface region 9 is performed before or after the wet repair treatment (hydrophobic treatment) with respect to the surface region 9. The moisture causes the generation of Si—OH group.

The heat treatment is performed, for example, in a temperature range of 150° C.-400° C. If the heat treatment is performed in the temperature range, the moisture is effectively removed without causing a problem.

According to the present embodiment, the generation of Co residue (metal residue) is more effectively suppressed. Other similar effects as those obtained in the first embodiment are obtained in the present embodiment.

Third Embodiment

In the first embodiment, Si—OH (hydrophilic group) is chemically substituted with Si—CH$_3$ (hydrophobic group) to render the surface region 9 hydrophobic, but in the present embodiment, hydrophobic substance, for example, solution containing polyallylene is absorbed in the surface region 9 to render the surface region 9 hydrophobic. As the surface region 9 has a lower concentration than the cap insulating film 4, the hydrophobic treatment by absorption of hydrophobic substance is easily performed. The same effect as the first embodiment is obtained in the present embodiment.

Another method for rendering the surface region 9 hydrophobic without chemically replacing Si—OH with Si—CH$_3$ is coating the surface region 9 with hydrophobic substance containing C, for example, an organic insulating film. The same effect as the first embodiment is obtained in this method.

In addition, the heat treatment for removing moisture may be employed in the present embodiment as in the second embodiment with the same temperature range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   an insulating film including silicon, oxygen, carbon and hydrogen provided above a semiconductor substrate, the insulating film being provided with a wiring trench, the insulating film comprising first and second regions,
   the first region including a surface of the insulating film,
   the second region provided beneath the first region and including an interface with the first region,
   a carbon concentration of the second region from the interface to a predetermined distance of depth becoming lower as the depth from the interface becoming deeper,
   a carbon concentration of the second region deeper than the predetermined distance becoming higher as the depth becoming deeper and reaching carbon concentration higher than that of the surface of the insulating film;
   a metal wiring provided in the wiring trench; and
   a metal cap provided on an upper surface of the metal wiring.

2. The device of claim 1, wherein carbon concentration of the first region increases as a distance from the interface increases.

3. The device of claim 1, wherein carbon concentration of the first and second regions indicates a local minimal value in the second region.

4. The device of claim 1, wherein carbon concentration of a region deeper than the second region of the insulating film is higher than carbon concentration of the second region.

5. The device of claim 1, wherein carbon concentration of the insulating film peaks in a region deeper than the second region.

6. The device of claim 1, wherein carbon concentration of the insulating film indicates a local maximal value in a region deeper than the second region.

7. The device of claim 1, wherein metal material of the metal wiring is copper, material of the metal cap is cobalt, ruthenium, tungsten or alloy containing at least two of the metals.

8. The device of claim 1, wherein the insulating film includes at least one of an insulating film having dielectric constant less than 2.5, a SiOC type insulating film, and an organic insulating film.

* * * * *